United States Patent
Farooq et al.

(10) Patent No.: US 9,159,674 B2
(45) Date of Patent: Oct. 13, 2015

(54) BONDED STRUCTURE WITH ENHANCED ADHESION STRENGTH

(71) Applicant: INTERNATIONAL BUSINESS MACHINES CORPORATION, Armonk, NY (US)

(72) Inventors: Mukta G. Farooq, Hopewell Junction, NY (US); Zhengwen Li, Hopewell Junction, NY (US); Zhijiong Luo, Carmel, NY (US); Huilong Zhu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

(21) Appl. No.: 14/268,116

(22) Filed: May 2, 2014

(65) Prior Publication Data

US 2014/0239458 A1 Aug. 28, 2014

Related U.S. Application Data

(62) Division of application No. 12/700,813, filed on Feb. 5, 2010, now Pat. No. 8,748,288.

(51) Int. Cl.
*H01L 23/538* (2006.01)
*B32B 15/20* (2006.01)
(Continued)

(52) U.S. Cl.
CPC ............ *H01L 23/5384* (2013.01); *B32B 15/20* (2013.01); *C22C 9/00* (2013.01); *C23C 14/48* (2013.01); *H01L 23/481* (2013.01); *H01L 24/29* (2013.01); *H01L 24/32* (2013.01); *H01L 24/83* (2013.01); *H01L 25/0657* (2013.01); *B32B 2457/14* (2013.01); *H01L 2224/8082* (2013.01); *H01L 2224/80357* (2013.01); (Continued)

(58) Field of Classification Search
CPC ....................................................... H01L 23/481
USPC ................................... 438/455; 257/621, 774
See application file for complete search history.

(56) References Cited

U.S. PATENT DOCUMENTS

| 4,774,196 A | 9/1988 | Blanchard |
| 4,849,247 A | 7/1989 | Scanlon et al. |

(Continued)

OTHER PUBLICATIONS

Pedraza, D. F., "Ion Implantation-Induced Amorphization of Ceramic Oxides" Mat. Res.Soc. Symp. Proc. (Nov. 1989) pp. 561-567, vol. 157.

*Primary Examiner* — Mohammad Islam
*Assistant Examiner* — John P Dulka
(74) *Attorney, Agent, or Firm* — Scully, Scott, Murphy & Presser, P.C.; Joseph P. Abate, Esq.

(57) ABSTRACT

A first bonding material layer is formed on a first substrate and a second bonding material layer is formed on a second substrate. The first and second bonding material layers include a metal. Ions are implanted into the first and second bonding material layers to induce structural damages in the in the first and second bonding material layers. The first and second substrates are bonded by forming a physical contact between the first and second bonding material layers. The structural damages in the first and second bonding material layers enhance diffusion of materials across the interface between the first and second bonding material layers to form a bonded material layer in which metal grains are present across the bonding interface, thereby providing a high adhesion strength across the first and second substrates.

12 Claims, 8 Drawing Sheets

(51) Int. Cl.
*H01L 23/48* (2006.01)
*H01L 23/00* (2006.01)
*H01L 25/065* (2006.01)
*C23C 14/48* (2006.01)
*C22C 9/00* (2006.01)

(52) U.S. Cl.
CPC ......... *H01L 2224/80895* (2013.01); *H01L 2224/80896* (2013.01); *H01L 2224/838* (2013.01); *H01L 2224/8382* (2013.01); *H01L 2225/06541* (2013.01); *H01L 2924/0103* (2013.01); *H01L 2924/0105* (2013.01); *H01L 2924/01006* (2013.01); *H01L 2924/01013* (2013.01); *H01L 2924/01019* (2013.01); *H01L 2924/01023* (2013.01); *H01L 2924/01024* (2013.01); *H01L 2924/01029* (2013.01); *H01L 2924/0132* (2013.01); *H01L 2924/01033* (2013.01); *H01L 2924/0133* (2013.01); *H01L 2924/01044* (2013.01); *H01L 2924/01045* (2013.01); *H01L 2924/01047* (2013.01); *H01L 2924/01049* (2013.01); *H01L 2924/01073* (2013.01); *H01L 2924/01074* (2013.01); *H01L 2924/01077* (2013.01); *H01L 2924/01078* (2013.01); *H01L 2924/01079* (2013.01); *H01L 2924/01327* (2013.01); *H01L 2924/12044* (2013.01); *H01L 2924/1305* (2013.01); *H01L 2924/1306* (2013.01); *H01L 2924/19041* (2013.01); *Y10T 428/12472* (2015.01)

(56) References Cited

U.S. PATENT DOCUMENTS

| | | |
|---|---|---|
| 5,374,564 A | 12/1994 | Bruel |
| 5,503,704 A | 4/1996 | Bower et al. |
| 6,563,133 B1 | 5/2003 | Tong |
| 7,524,736 B2 | 4/2009 | Ottaviani et al. |
| 2002/0157790 A1 | 10/2002 | Abe et al. |
| 2003/0017679 A1 | 1/2003 | Lee et al. |
| 2004/0171196 A1 | 9/2004 | Walitzki |
| 2005/0048758 A1* | 3/2005 | Hosseini et al. ......... 438/614 |
| 2006/0270192 A1 | 11/2006 | Cheng |
| 2007/0148917 A1 | 6/2007 | Morita et al. |
| 2007/0184631 A1 | 8/2007 | Nakamura et al. |
| 2007/0243694 A1 | 10/2007 | Morita et al. |
| 2008/0061333 A1* | 3/2008 | Hidaka ............... 257/295 |
| 2008/0061452 A1 | 3/2008 | Nishihata et al. |
| 2008/0211061 A1 | 9/2008 | Atwater, Jr. et al. |
| 2008/0248631 A1 | 10/2008 | Letertre et al. |
| 2008/0293217 A1 | 11/2008 | Ghyselen et al. |
| 2009/0121260 A1 | 5/2009 | Bernstein et al. |
| 2009/0160005 A1 | 6/2009 | Lee |
| 2009/0224371 A1* | 9/2009 | Yu et al. ............. 257/621 |
| 2009/0278233 A1 | 11/2009 | Pinnington et al. |

\* cited by examiner

BONDED STRUCTURE WITH ENHANCED ADHESION STRENGTH

CROSS REFERENCE TO RELATED APPLICATION

This application is a divisional of U.S. patent application Ser. No. 12/700,813, filed Feb. 5, 2010 the entire content and disclosure of which is incorporated herein by reference.

BACKGROUND

This invention relates to a bonded structure that provides high adhesion strength through enhanced interfacial diffusion of a bonding material and methods of manufacturing the same.

Bonding of multiple substrates is required to enable three-dimensional integration of chips. Bonding of two substrates can be effected by adhesion between two dielectric materials as in an oxide-to-oxide bonding that fuses silicon dioxide materials from two substrates after bonding, by adhesion between two metallic materials as in a copper-to-copper bonding that employs direct contact between two copper pads and a subsequent grain growth across the original interface between the two copper pads, or by a method employing a combination of the two adhesion mechanisms.

Through-substrate-via (TSV) structures, formed after multiple substrates are bonded and optionally thinned, provide electrical connection across the multiple substrates in a bonded structure. A TSV structure includes a conductive material such as copper, which diffuses rapidly in the plane of the bonding interface between substrates because microscopic irregularities and cavities are present at the interface. Diffusion of the conductive material from a TSV structure can cause electrical shorts and reliability problems in the bonded structure.

An interface between diffusion resistant materials, such as silicon nitride, across bonded substrates can be employed to reduce later diffusion of conductive material from TSV structures. In this case, the diffusion resistant materials retard lateral diffusion of the conductive material from the TSV structures along the interface between two bonded substrates, thereby preventing electrical shorts.

The adhesion strength between the two substrates is mostly provided by the metal-to-metal contact between the metal pads that are embedded in the diffusion resistant materials. To provide sufficient adhesion strength between the two substrates in this type of structure, atomic diffusion of the bonding material to mix metal atoms needs to be effected. To provide sufficient atomic diffusion of metallic materials, a high temperature anneal for an extended time is needed, for example, in an anneal at a temperature about 500° C. for many hours. Such a prolonged anneal at an elevated temperature adversely affects the performance and reliability of semiconductor devices in the bonded substrate.

SUMMARY

In an embodiment of the present invention, a first bonding material layer is formed on a first substrate and a second bonding material layer is formed on a second substrate. The first and second bonding material layers include a metal. Ions are implanted into the first and second bonding material layers to induce structural damages in the first and second bonding material layers. The first and second substrates are bonded by forming a physical contact between the first and second bonding material layers. The structural damages in the first and second bonding material layers enhance diffusion of materials across the interface between the first and second bonding material layers to form a bonded material layer in which metal grains are present across the bonding interface, thereby providing a high adhesion strength across the first and second substrates.

According to an aspect of the present invention, a method of forming a bonded structure is provided, which includes forming a first bonding material layer on a surface of a first substrate; forming a second bonding material layer on a surface of a second substrate; implanting ions into at least one of the first and second bonding material layers, wherein the ions generate a structural damage to the at least one of the first and second bonding material layers; and bringing into physical contact and annealing the first and second bonding material layers, whereby the first and second bonding material layers are bonded to each other to provide adhesion strength between the first and second substrates.

According to another aspect of the present invention, a bonded structure is provided, which includes a vertical stack, from bottom to top, of a first substrate, a bonded material layer of a first bonding material layer and a second bonding material layer, and a second substrate, wherein the bonded material layer includes grains extending across an interface between the first and second bonding material layers, the first bonding material layer includes at least one first metallic material portion having a first metallic composition, the second bonding material layer includes at least one second metallic material portion having a second metallic composition, wherein the first metallic composition is different from the second metallic composition.

DETAILED DESCRIPTION

As stated above, the present invention relates to a bonded structure that provides a high adhesion strength through enhanced interfacial diffusion of a bonding material and methods of manufacturing the same, which are now described in detail with accompanying figures. The drawings are not necessarily drawn to scale.

As used herein, a "metal" refers to any elemental metal in the Periodic Table of Elements.

As used herein, a "non-metal" refers to any element that is not an elemental metal in the Periodic Table of Elements.

As used herein, a "metallic material" is a material including at least one elemental metal. A metallic material may consist of an elemental metal, an intermetallic alloy of at least two elemental metals, or an alloy of at least one elemental metal and at least one non-metallic element.

As used herein, an "intermetallic alloy" is an alloy consisting of at least two elemental metals.

As used herein, a "metallic alloy" is a conductive alloy including at least one elemental metal and at least another element.

As used herein, a "conductive metallic material" is a metallic material that is conductive, i.e., non-insulating.

As used herein, a "metallic composition" is a composition of matter including at least one elemental metal. A metallic composition of matter may consist of one or more elemental metals, or may include at least one elemental metal and at least one elemental non-metal.

As used herein, a "diffusion resistant dielectric material" is a dielectric material that is known to block or retard diffusion of atomic metal. For example, silicon nitride is a diffusion resistant dielectric material.

As used herein, a "diffusion resistant dielectric material layer" is a patterned or unpatterned layer of a diffusion resistant dielectric material.

As used herein, a "conductive inter-substrate connection structure" is a conductive structure that provides an electrical connection across two substrates.

Figure 1:
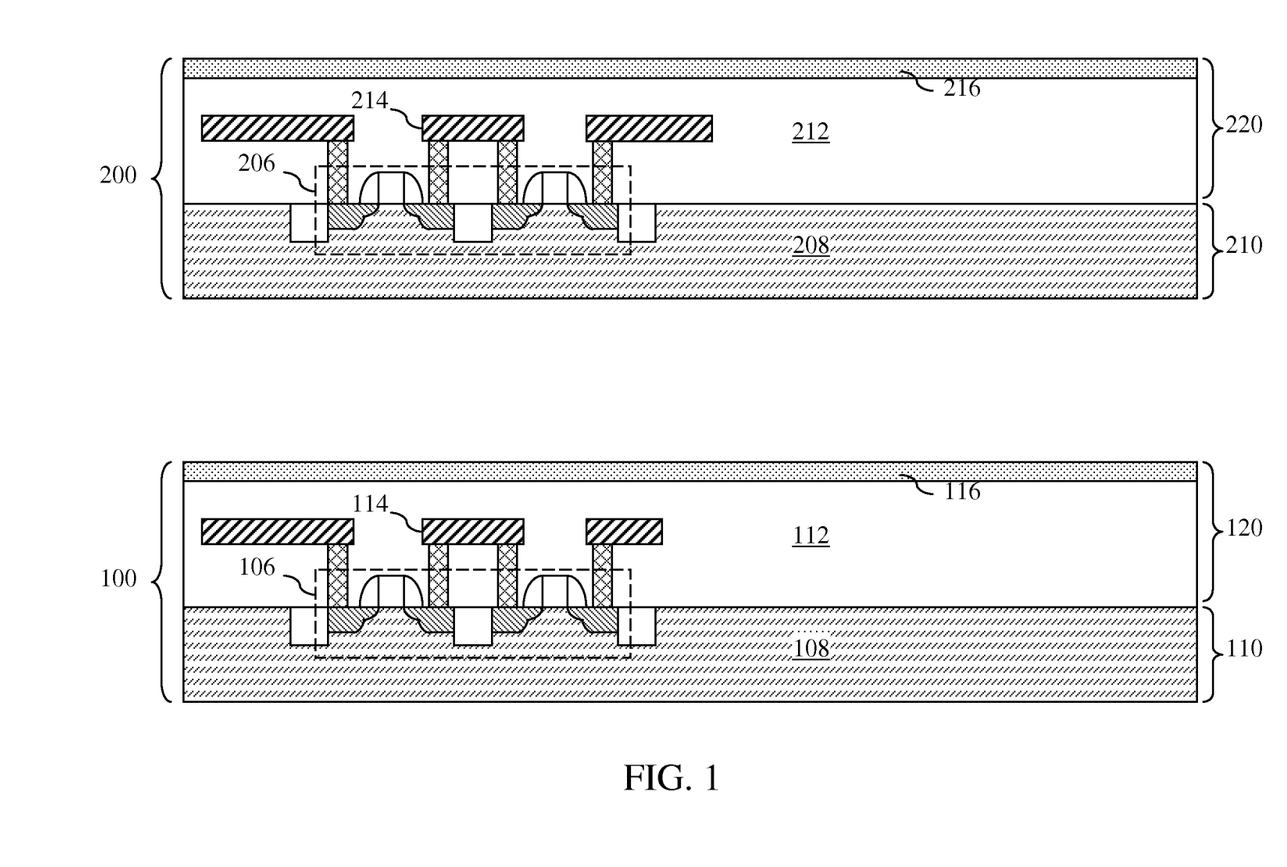
FIG. 1 is a vertical cross-sectional view of a first exemplary structure including a first substrate and a second substrate according to a first embodiment of the present invention.

Referring to FIG. 1, a first exemplary structure according to a first embodiment of the present invention includes a first substrate 100 and a second substrate 200 that are separated from each other. The first substrate 100 can include a first semiconductor substrate 110 and a first interconnect level layer 120. The second substrate 200 can include a second semiconductor substrate 210 and a second interconnect level layer 220.

The first semiconductor substrate 110 includes a first semiconductor layer 108. At least one first semiconductor device 106 can be present on the first semiconductor layer 108. Likewise, the second semiconductor substrate 210 includes a second semiconductor layer 208. At least one second semiconductor device 206 can be present on the second semiconductor layer 208. Each of the at least one first semiconductor device 106 and the at least one second semiconductor device 206 can be, but is not limited to, a field effect transistor, a bipolar transistor, a diode, a resistor, a capacitor, a varactor, an inductor, a carbon nanotube device, or any other type of semiconductor device or a nanoscale device. As an illustrative example, field effect transistors are depicted as the at least one first semiconductor device 106 and the at least one second semiconductor device 206 in FIG. 1. A buried insulator layer (not shown) and/or a handle substrate (not shown) can be provided under the first semiconductor layer 108 and/or the second semiconductor layer 208.

Each of the first semiconductor layer 108 and the second semiconductor layer 208 comprises a semiconductor material. Preferably, the semiconductor material is a single crystalline semiconductor material having an epitaxial alignment among atoms within the entirety of the top semiconductor layer. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon.

The first interconnect level layer 120 includes at least one first dielectric material layer 112 and optionally includes a first diffusion resistant dielectric material layer 116 located thereupon. The second interconnect level layer 220 includes at least one second dielectric material layer 212 and optionally includes a second diffusion resistant dielectric material layer 216 located thereupon.

Each of the at least one first dielectric material layer 112 and the at least one second dielectric material layer 212 includes at least one dielectric material, which can be a doped or undoped silicate glass, silicon nitride, a low dielectric constant (low-k) chemical vapor deposition (CVD) material such as organosilicate glass, a low-k spin-on dielectric material such as SiLK™, BLOk™, NBLOk™, or any other type of dielectric material that can be deposited or formed on a substrate and able to hold at least one metal pad therein. Further, at least one first metal interconnect structure 114 can be embedded in the at least one first dielectric material layer 112 to provide electrical connection to the at least one first semiconductor device 106. Likewise, at least one second metal interconnect structure 214 can be embedded in the at least one second dielectric material layer 214 to provide electrical connection to the at least one second semiconductor device 206.

Each of the at least one first dielectric material layer 112 and the at least one second dielectric material layer 212 can include a plurality of dielectric material layers having different compositions. The composition of the at least one first dielectric material layer 112 and the at least one second dielectric material layer 212 can include any dielectric material known in semiconductor processing technology and can be adjusted as needed.

An upper portion of the first substrate 100 may optionally include a first diffusion resistant dielectric material layer 116, which includes a first diffusion resistant dielectric material such as silicon nitride. The thickness of the first diffusion resistant dielectric material layer 116 can be from 50 nm to 6,000 nm, and is typically from 200 nm to 2,000 nm, although lesser and greater thicknesses can also be employed. Likewise, an upper portion of the second substrate 200 may optionally includes a second diffusion resistant dielectric material layer 216, which includes a second diffusion resistant dielectric material such as silicon nitride. The thickness of the second diffusion resistant dielectric material layer 216 can be in the same range as the thickness of the first diffusion resistant dielectric material layer 116. The exposed upper surfaces of the first and second substrates (100, 200) are planar. The exposed upper surface of the first substrate 100 can be a surface of the at least one first dielectric material layer 112 or a surface of the first diffusion resistant dielectric material layer 116. The exposed upper surface of the second substrate 200 can be a surface of the at least one second dielectric material layer 212 or a surface of the second diffusion resistant dielectric material layer 216.

Figure 2:
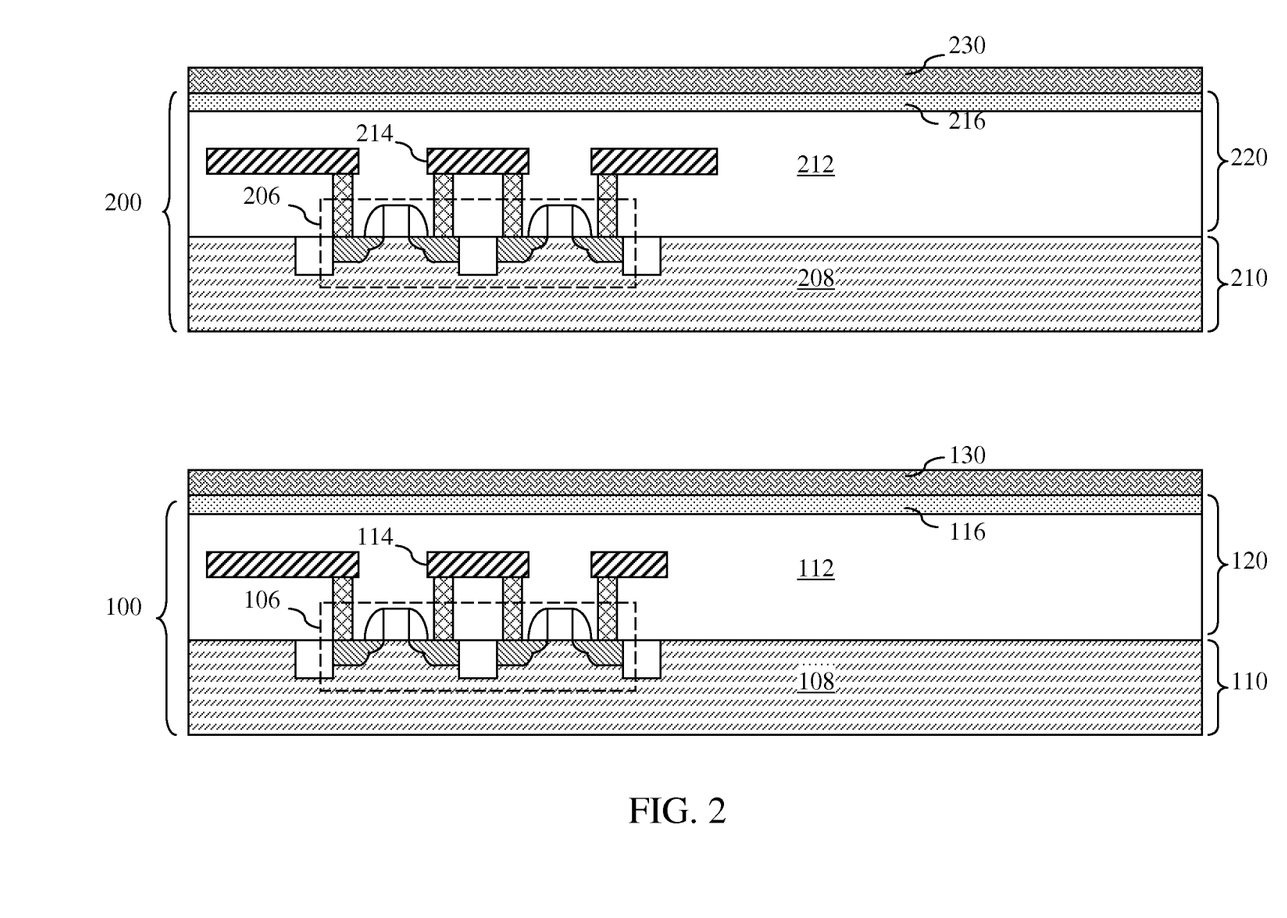
FIG. 2 is a vertical cross-sectional view of the first exemplary structure after formation of a first bonding material layer and a second bonding material layer according to the first embodiment of the present invention.

Referring to FIG. 2, a first bonding material layer 130 and a second bonding material layer 230 are formed on the exposed upper surfaces of the first substrate 100 and the second substrate 200, respectively. The first bonding material layer 130 can be a first metallic material layer that has a first metallic composition. The second bonding material layer 230 can be a second metallic material layer that has a second metallic composition.

In one embodiment, the first bonding material layer 130 consists of a first elemental metal and the second bonding material layer 230 consists of a second elemental metal. The first elemental metal can be the same as the second elemental metal, or the first elemental metal can be different from the second elemental metal. The first element metal and the second elemental metal can be any elemental metal in the Periodic Table of Elements. Preferably, each of the first elemental metal and the second elemental metal is selected from Cu, Ag, Au, Al, W, Ta, and Ti. More preferably, the first elemental metal and the second elemental metal are selected from Cu, Ag, Au, and W.

In another embodiment, one of the first bonding material layer 130 and the second bonding material layer 230 consists of an elemental metal and the other of the first bonding material layer 130 and the second bonding material layer 230 consists of an intermetallic alloy of at least two metals or a metallic alloy of at least one elemental metal and at least one non-metal element. For example, the first bonding material layer 130 can consist of a first elemental metal, and the second bonding material layer 230 can consist of an intermetallic alloy or a metallic alloy including a second elemental metal. Alternately, the first bonding material layer 130 can consist of an intermetallic alloy or a metallic alloy including a first elemental metal, and the second bonding material layer 130 can consist of a second elemental metal. In each case, the first elemental metal can be the same as the second elemental metal, or the first elemental metal can be different from the second elemental metal. The first element metal and the second elemental metal can be any elemental metal in the Periodic Table of Elements. Preferably, each of the first elemental metal and the second elemental metal is selected from Cu, Ag, Au, Al, W, Ta, and Ti. More preferably, the first elemental metal and the second elemental metal are selected from Cu, Ag, Au, and W.

In yet another embodiment, the first bonding material layer 130 includes a first metallic alloy including a first elemental metal and at least another element, and the second bonding material layer 230 includes a second metallic alloy including a second elemental metal and at least another element. The first elemental metal can be the same as the second elemental metal, or the first elemental metal can be different from the second elemental metal. Further, the first bonding material layer 130 and the second bonding material layer 230 can be composed of a same metallic alloy having a same composition or different metallic alloys having different compositions. The first element metal and the second elemental metal can be any elemental metal in the Periodic Table of Elements. Preferably, each of the first elemental metal and the second elemental metal is selected from Cu, Ag, Au, Al, W, Ta, and Ti. More preferably, the first elemental metal and the second elemental metal are selected from Cu, Ag, Au, and W.

The first bonding material layer 130 and the second bonding material layer 230 can be formed, for example, by physical vapor deposition (PVD), chemical vapor deposition (CVD), electroplating, electroless plating, or a combination thereof. The thicknesses of the first bonding material layer 130 and the second bonding material layer 230 can be from 10 nm to 5,000 nm, and preferably from 100 nm to 1,000 nm, although lesser and greater thicknesses can also be employed. The first bonding material layer 130 can be a first metallic material layer and having a first constant thickness throughout, and the second bonding material layer 230 can be a second metallic material layer having a second constant thickness throughout.

Figure 3:
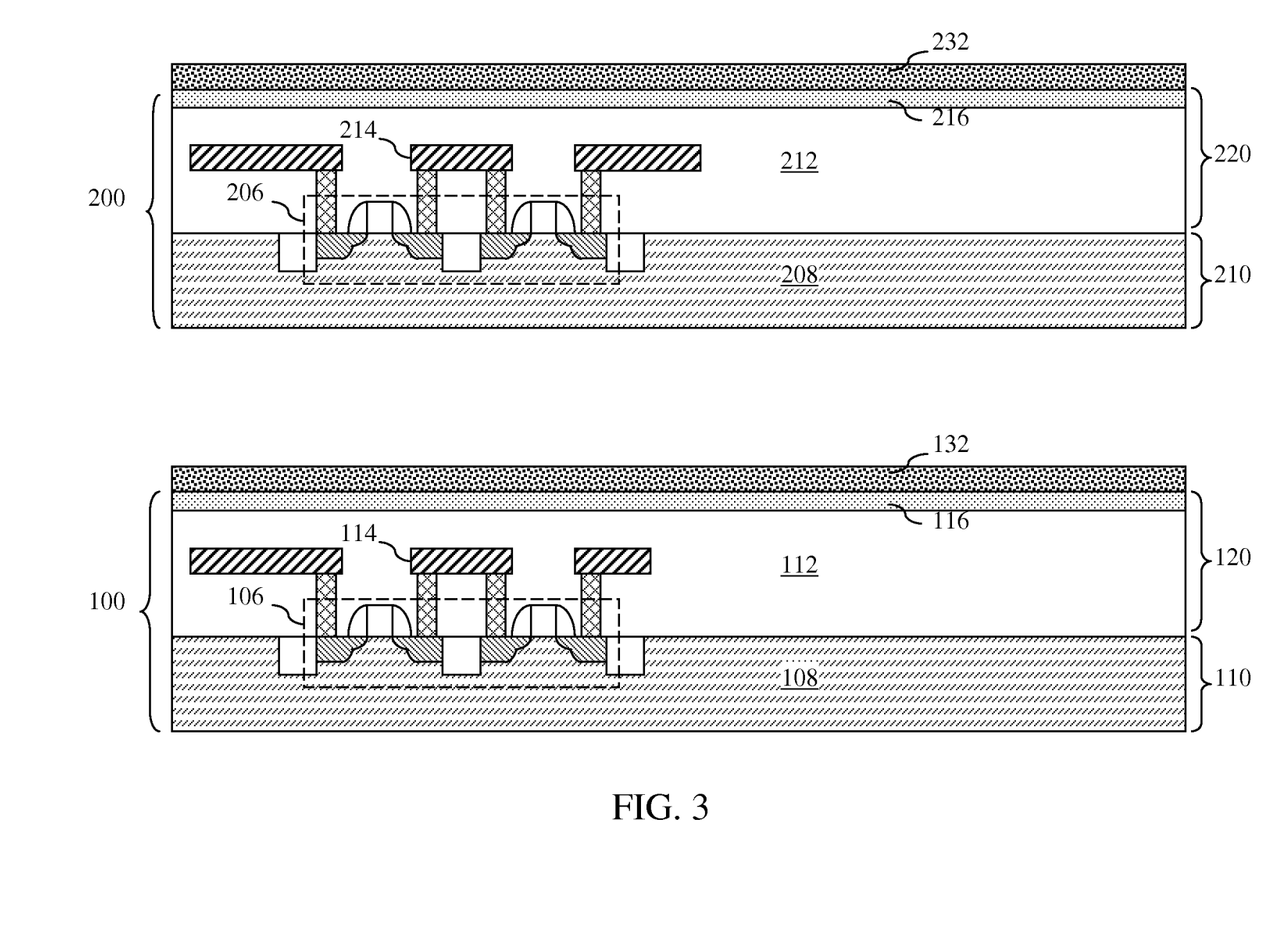
FIG. 3 is a vertical cross-sectional view of the first exemplary structure after implanting ions into the first bonding material layer and the second bonding material layer according to the first embodiment of the present invention.

Referring to FIG. 3, ions are implanted into at least one of the first bonding material layer 130 and the second bonding material layer 230. Preferably, ions are implanted into the first bonding material layer 130 and the second bonding material layer 230. The ions generate structural damages in the first bonding material layer 130 and/or the second bonding material layer 230 to a degree that accelerates a grain growth across an interface between the first and second bonding material layers (130, 230) during a subsequent anneal process performed after the first and second bonding material layers (130, 230) are brought into physical contact. If implanted with ions, the first bonding material layer 130 becomes structurally damaged, and is hereinafter referred to as a first structurally damaged bonding material layer 132, i.e., a first bonding material layer having structural damages. If implanted with ions, the second bonding material layer 130 becomes structurally damaged, and is hereinafter referred to as a second structurally damaged bonding material layer 232, i.e., a second bonding material layer having structural damages.

Structural defects increase due to the structural damage that the implanted ions introduce into each of the first and second structurally damaged bonding material layers (132, 232). Depending on the energy and the dose of the ions implanted, the first and second structurally damaged bonding material layers (132, 232) can be amorphized or structurally damaged without amorphization to have an increased density of defects. Preferably, at least one of the first metallic material layer 130 and the second metallic material layer 230 is amorphized by the ion implantation so that at least one of the first or second structurally damaged bonding material layers (132 or 232) has an amorphized structure. More preferably, the first metallic material layer 130 and the second metallic material layer 230 are amorphized by the ion implantation so that the first and second structurally damaged bonding material layers (132, 232) have amorphized structures.

If a microcrystalline structure is preserved in any degree in the first or second structurally damaged bonding material layers (132 or 232), the grain size decreases in the first or second structurally damaged bonding material layers (132 or 232). The amorphization of first and/or second structurally damaged bonding material layers (132, 232) can be effected by increasing the energy and the dose of ion implantation. While the present invention is described with structures including a first structurally damaged bonding material layer 132 and a second structurally damaged bonding material layer 232, embodiments in which a combination of a first structurally damaged bonding material layer 132 and a second bonding material layer 230 are employed for subsequently bonding or a combination of a first bonding material layer 130 and a second structurally damages bonding material layer 232 are employed for subsequent bonding are explicitly contemplated herein.

The species of ions implanted and incorporated into the first and second structurally damaged bonding material layers (132, 232) can include ions of at least one elemental metal, ions of a semiconductor element such as Si or Ge, and/or ions of elements selected from groups VA, VIA, VIIA, and VIIIA in the Periodic Table of Elements. The composition of the first structurally damaged bonding material layer 132 if ions are implanted to form the first structurally damaged bonding material layer 132, or the composition of the first bonding material layer 130 if ions are not implanted therein, is herein referred to a first metallic composition. The composition of the second structurally damaged bonding material layer 232, or the composition of the second bonding material layer 230 if ions are not implanted therein, is herein referred to as a second metallic composition.

The first structurally damaged bonding material layer 132 can be a first metallic material layer and having a first constant thickness and the first metallic composition throughout, and the second structurally damaged bonding material layer 232 can be a second metallic material layer having a second constant thickness and the second metallic composition throughout. The first metallic material layer and the second metallic material layer can be composed of a same elemental metal or a same metallic alloy. Alternately, the first metallic material layer and the second metallic material layer can be composed of different elemental metals or different metallic alloys.

In one embodiment, the first metallic composition is the same as the second metallic composition. For example, if the first bonding material layer 130 consist of Cu, and Cu ions are implanted into the first bonding material layer 130 to form the first structurally damaged bonding material layer 132, and if the second bonding material layer 230 consist of Cu, and Cu ions are implanted into the second bonding material layer 230 to form the second structurally damaged bonding material layer 232, the first metallic composition and the second metallic composition consist of Cu.

For example, if the first bonding material layer 130 and the second bonding material layer are composed of a same elemental metal or a same metallic alloy having a same composition, and if ions of the same species are implanted into the first bonding material layer 130 and the second bonding material layer 230 to form the first and second structurally damaged bonding material layers (132, 232), the first metallic composition and the second metallic composition can be the same if depending on the doses of the implanted ions.

In another embodiment, the first metallic composition is different from the second metallic composition. The first and second bonding material layers (130, 230) can have the same composition and different ion species can be implanted into the first and second bonding material layers (130, 230) to form the first and second structurally damaged bonding material layers (132, 232). Alternately, the first and second bonding material layers (130, 230) can have different compositions and the ion implantation may be performed in a manner that does not equalize the composition of the first and second structurally damaged bonding material layers (132, 232).

In yet another embodiment, the first metallic composition can be a first alloy including a first elemental metal and a second elemental metal, and the second metallic composition can be a second alloy of the first elemental metal and the second elemental metal such that the atomic percentage of the first elemental metal is different between the first metallic composition and the second metallic composition. The first elemental metal and the second elemental metal can be any elemental metals provided that the first elemental metal and the second elemental metal are different elemental metals. Preferably, each of the first elemental metal and the second elemental metal is selected from Cu, Ag, Au, Al, W, Ta, and Ti. In some cases, the atomic concentration of the first elemental metal may be greater than 50% in the first metallic composition, and the atomic concentration of the first elemental metal is less than 50% in the second metallic composition. For example, the first metallic composition can be a first alloy of Cu and Ag or a first alloy of Cu and Au, and the second metallic composition can be a second alloy of Cu and Ag or a second alloy of Cu and Au, in which the atomic percentage of Cu is greater than 50% in the first metallic composition and the atomic percentage of Cu is less than 50% in the second metallic composition.

In still another embodiment, the first metallic composition or the second metallic composition includes at least one semiconductor element selected from Si and Ge. In this embodiment, Si and/or Ge can be implanted into the first and/or second bonding material layers (130, 230) to be incorporated into the first and/or second structurally damaged bonding material layers (132, 232). The Si ions and/or Ge ions generate structural damage. Ions of a Si-including gas such as $SiH_4$ or ions of a Ge-including gas such as $GeH_4$ can be implanted and incorporated into the first and/or second structurally damaged bonding material layers (132, 232). The dose of the ions can be selected such that the first and/or second structurally damaged bonding material layers (132, 232) are amorphized after implantation.

In a further embodiment, elements selected from groups VA, VIA, VIIA, and VIIIA in the Periodic Table of Elements can be employed for ion implantation. Preferably, ions of a non-metal are implanted and incorporated into the first and/or second structurally damaged bonding material layers (132, 232).

Figure 4:
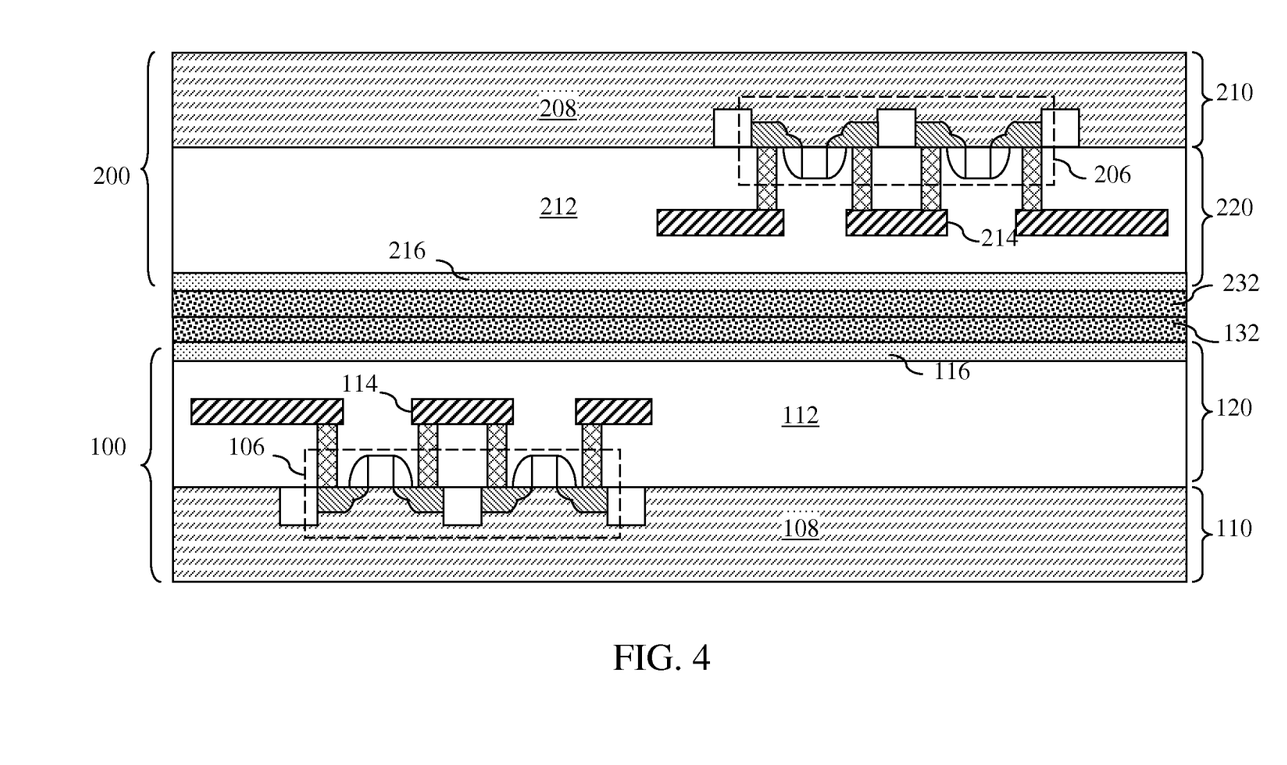
FIG. 4 is a vertical cross-sectional view of the first exemplary structure after bringing the first and second bonding material layers into physical contact according to the first embodiment of the present invention.

Referring to FIG. 4, the second substrate 200 is flipped upside down and brought into physical contact with the first substrate 100 such that a surface of the first structurally damaged bonding material layer 132 contacts a surface of the second structurally damaged bonding material layers 232. In case ions are not implanted into one of the first and second bonding material layers (130, 230), the first structurally damaged bonding material layer 132 can be brought into physical contact with the second bonding material layer 230 (See FIG. 2) or the first bonding material layer 130 (See FIG. 2) can be brought into physical contact with the second structurally damaged bonding material layer 232.

Figure 5:
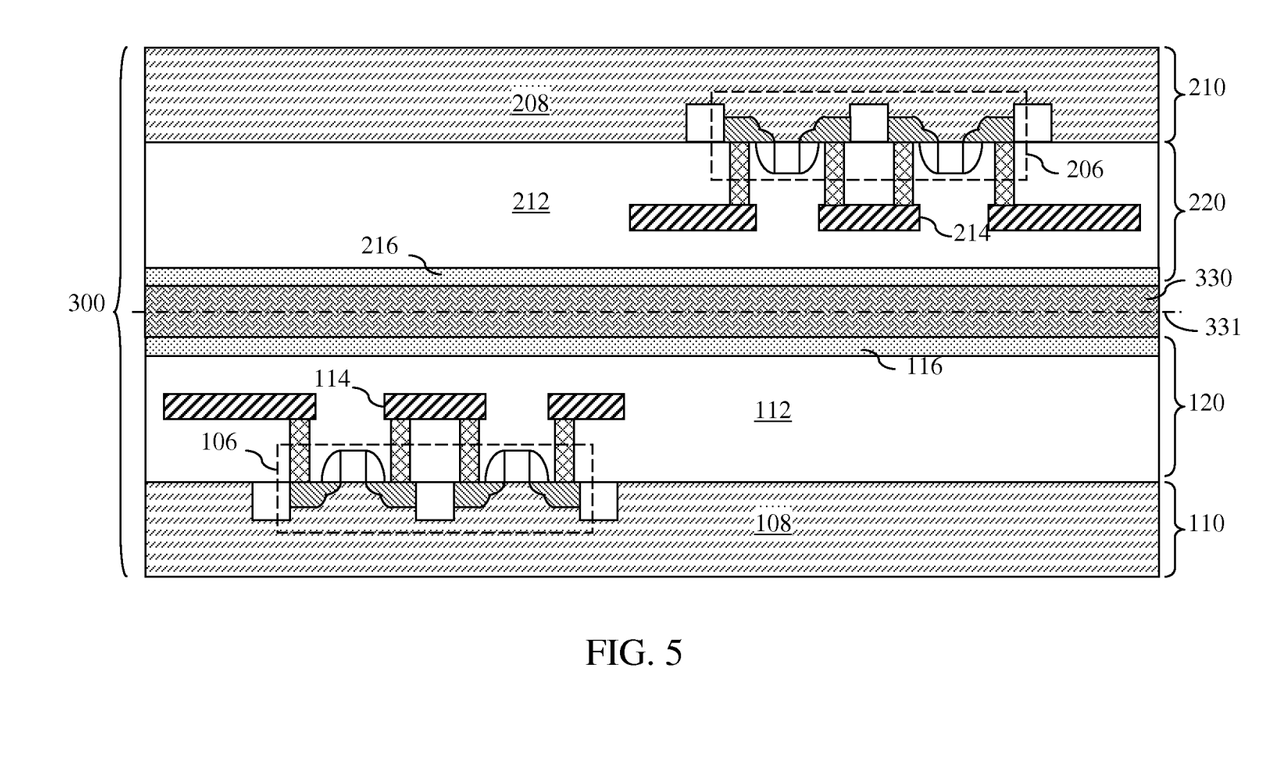
FIG. 5 is a vertical cross-sectional view of the first exemplary structure after forming a bonded material layer through an anneal according to the first embodiment of the present invention.

Referring to FIG. 5, the first and second substrates (100, 200) are bonded to each other to form a bonded structure 300. Specifically, bonding is effected at an interface 331 employing the combination of the first and second structurally damaged bonding material layers (132, 232; See FIG. 4), the combination of the first structurally damaged bonding material layer 132 and the second bonding material layer 230 (See FIG. 2), or the combination of the first bonding material layer 130 (See FIG. 2) and the second structurally damaged bonding material layer 232 to form a bonded material layer 330.

Once first and second structurally damaged bonding material layers (132, 232) contact each other, the assembly of the first and second substrates (100, 200) is subjected to a bonding process known in the art, which can include thermal cycling at an elevated temperature from 50° C. to 400° C., and typically from 100° C. to 300° C., and/or application of pressure so that the first and second substrates (100, 200; See FIG. 4) are pushed against each other. During the bonding process, the diffusion of the material in the first structurally damaged bonding material layer 132 is enhanced by the structural defects in the second structurally damaged bonding material layer 232, and the diffusion of the material in the second structurally damaged bonding material layer 232 is enhanced by the structural defects in the first structurally damaged bonding material layer 132. Typically, the diffusion of the material in the first structurally damaged bonding material layer 132 increases with the density of the structural defects in the second structurally damaged bonding material layer 232, and is maximized when the second structurally damaged bonding material layer 232 is amorphous. Similarly, the diffusion of the material in the second structurally damaged bonding material layer 232 increases with the density of the structural defects in the first structurally damaged bonding material layer 132, and is maximized when the first structurally damaged bonding material layer 132 is amorphous. The enhanced diffusion of materials across the interface 331 increased the adhesive strength across the interface 331 between the materials of the upper and lower portions of the bonded material layer 330.

The structural defects in the first and second structurally damaged bonding material layers (132, 232) provide an additional benefit of increasing the size of grains obtained after anneal in bonded material layer 330. Typically, the size of the grains increases with the density of structural defects in the first and second structurally damaged bonding material layers (132, 232), and is maximized if the first and second structurally damaged bonding material layers (132, 232) are amorphous before the anneal. A larger grain size increases adhesion strength within the bonded material layer 330 after the anneal.

The bonded material layer 330 includes a first bonding material layer (not separately shown) located below the interface 331 and a second bonding material layer (not separately shown) located above the interface 331. The first bonding material layer and the second bonding material layer are of integral construction and collectively constitute the bonded material layer 330. It is understood that the interface 331 is shown only for the demonstrative purpose of marking the original location at which the first and second structurally damaged bonding material layers (132, 232; See FIG. 4) contact each other. Further, it is understood that the interface 331 may not be physically discernable once the bonded material layer 330 is formed because materials diffuse across the interface 331 during the bonding process.

The first and second bonding material layers are bonded to each other to form the bonded material layer 330 within which grains extend across the interface 331 to provide adhesion strength between the first and second substrates (100, 200) within the bonded structure 300. The bonded structure 300 includes a vertical stack, from bottom to top, of the first substrate 100, the bonded material layer 330 of the first bonding material layer and the second bonding material layer, and the second substrate 200. The bonded material layer 300 includes grains extending across the interface 331 between the first and second bonding material layers.

The first bonding material layer below the interface 331 is a first metallic material layer having a first metallic composition, which can be substantially the same as the first metallic composition of the first structurally damaged bonding material layer 132 (or the first metallic composition of the first bonding material layer 130 if ions are not implanted at a step corresponding to FIG. 3). The difference in the compositions between the first metallic composition of the first bonding material layer and the first metallic composition of the first structurally damaged bonding material layer 132 is caused by the material diffusion across the interface 331 during the anneal employed for bonding. The first metallic material layer is a single contiguous first metallic material portion, i.e., a portion of the first metallic material of the first bonding material layer.

The second bonding material layer above the interface 331 is a second metallic material layer having a second metallic composition, which can be substantially the same as the second metallic composition of the second structurally damaged bonding material layer 232 (or the second metallic composition of the second bonding material layer 230 if ions are not implanted at a step corresponding to FIG. 3). The difference in the compositions between the second metallic composition of the second bonding material layer and the second metallic composition of the second structurally damaged bonding material layer 232 is caused by the material diffusion across the interface 331 during the anneal employed for bonding. The second metallic material layer is a single contiguous second metallic material portion, i.e., a portion of the second metallic material of the second bonding material layer.

The first metallic composition can be the same as the second metallic composition, or can be different from the second metallic composition.

Figure 6:
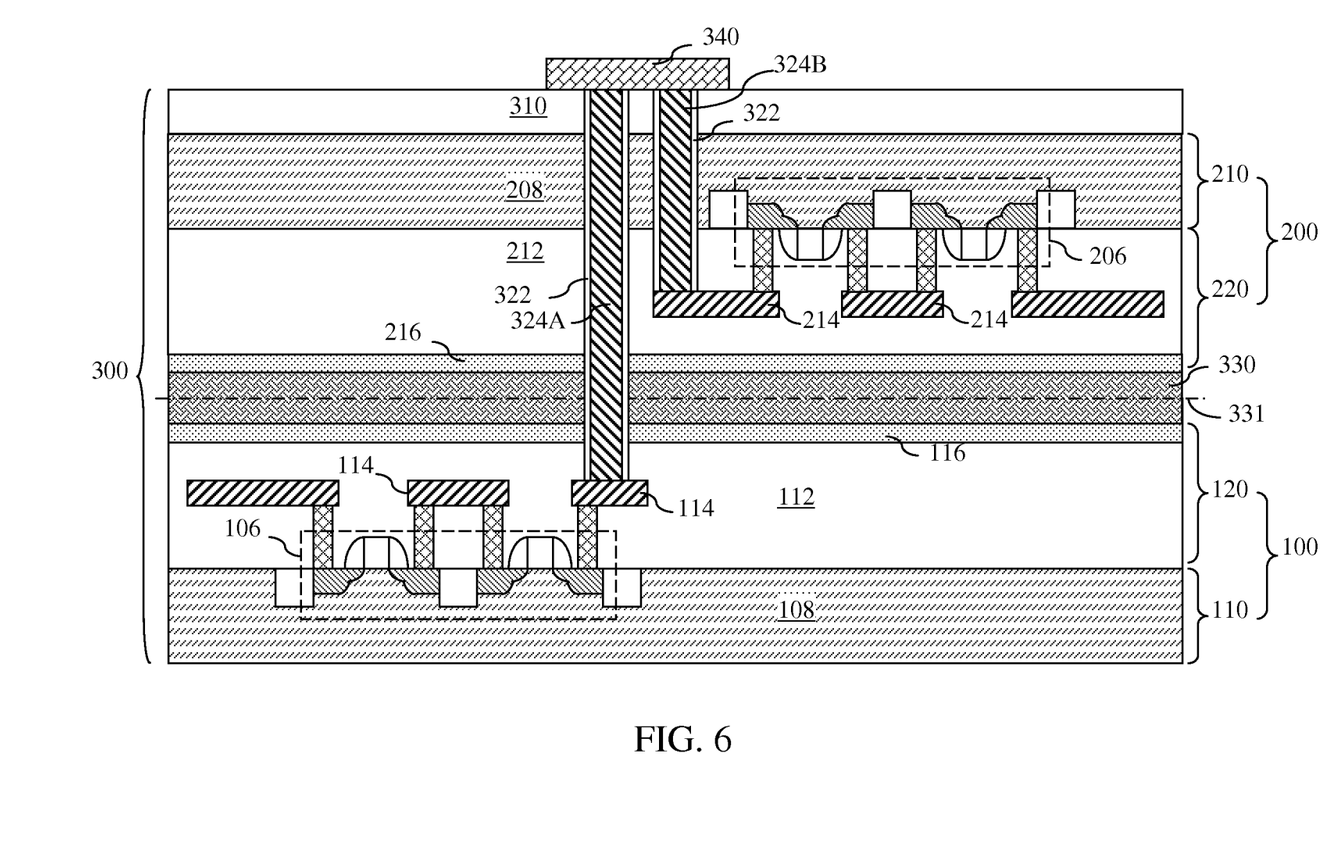
FIG. 6 is a vertical cross-sectional view of the first exemplary structure after formation of conductive inter-substrate connection structures according to the first embodiment of the present invention.

Referring to FIG. 6, conductive inter-substrate connection structures are formed in and/or on the bonded structure 300. The conductive inter-substrate connection structures can include a set of conductive structures that conductively connects the at least one first semiconductor device 106 to the at least one second semiconductor device 206. The set of conductive structures can include a first conductive via structure 324A extending through the bonded material layer 330, the second substrate 200, and a portion of the first substrate 100, a second conductive via structure 324B extending through a portion of the second substrate 200, and a conductive plate 340 that contacts the first conductive via structure 324A and the second conductive via structure 324B.

The first conductive via structure 324A and the second conductive via structure 324B can be formed, for example, by forming a dielectric material layer 310 on a surface of the second substrate 200 (or on a surface of the first substrate 100), by forming via cavities in the bonded structure 300 by lithographic patterning and etching, by filling the via cavities with a conductive material, and by removing excess portions of the conductive material from above the top surface of the dielectric material layer 310 by planarization. Dielectric liners 322 can be formed on the sidewalls of the via cavities before the filling of the via cavities to provide electrical isolation of the first conductive via structure 324A and the second conductive via structure 324B from elements other than the at least one first metal interconnect structure 114 and the at least one second metal interconnect structure 214. The first conductive via structure 324A and the second conductive via structure 324B can be formed by physical vapor deposition (PVD), chemical vapor deposition (CVD), electroplating, electroless plating, or a combination thereof. The first conductive via structure 324A and the second conductive via structure 324B can include an elemental metal or an intermetallic alloy. In case the first conductive via structure 324A and the second conductive via structure 324B are formed by electroplating or electroless plating, the first conductive via structure 324A and the second conductive via structure 324B can be composed of an electroplatable material or an electrolessplatable material, which can be, for example, Ni, Au, Ag, Rh, Ru, Ir, Cr, Sn, Zn, Cd, CoWP, or combinations thereof. The conductive plate 340 can be subsequently formed by deposition of a conductive metal layer, followed by lithographic patterning of the conductive metal layer.

Figure 7:
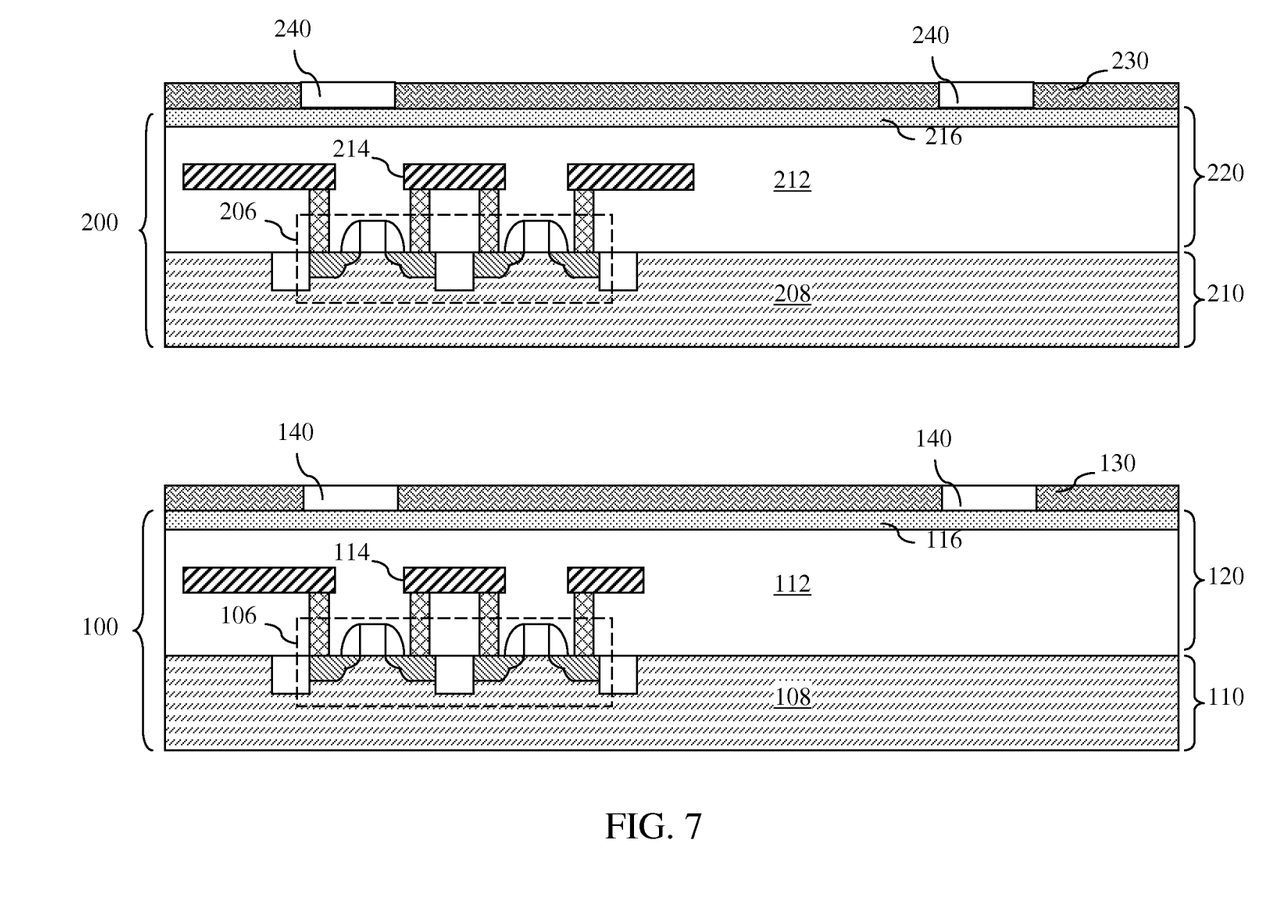
FIG. 7 is a vertical cross-sectional view of a second exemplary structure in which first and second substrates include at least one dielectric material portion according to a second embodiment of the present invention.

Referring to FIG. 7, a second exemplary structure according to a second embodiment of the present invention is derived from the first exemplary structure of FIG. 2 by forming at least one first dielectric material portion 140 in the same level as the first bonding material layer 130 on the first substrate 100 and at least one second dielectric material portion 240 in the same level as the second bonding material layer 230. Each of the at least one first dielectric material portion 140 and the at least one second dielectric material portion 240 includes a dielectric material such as silicon oxide and silicon nitride. Preferably, the at least one first dielectric material portion 140 and the at least one second dielectric material portion 230 comprise a silicon oxide material such as an undoped silicate glass (USG) or a doped silicate glass to provide additional adhesion between the at least one first dielectric material portion 140 and the at least one second dielectric material portion 230 upon bonding. Processing steps corresponding to FIGS. 3-6 are performed in the same manner as in the first embodiment.

Figure 8:
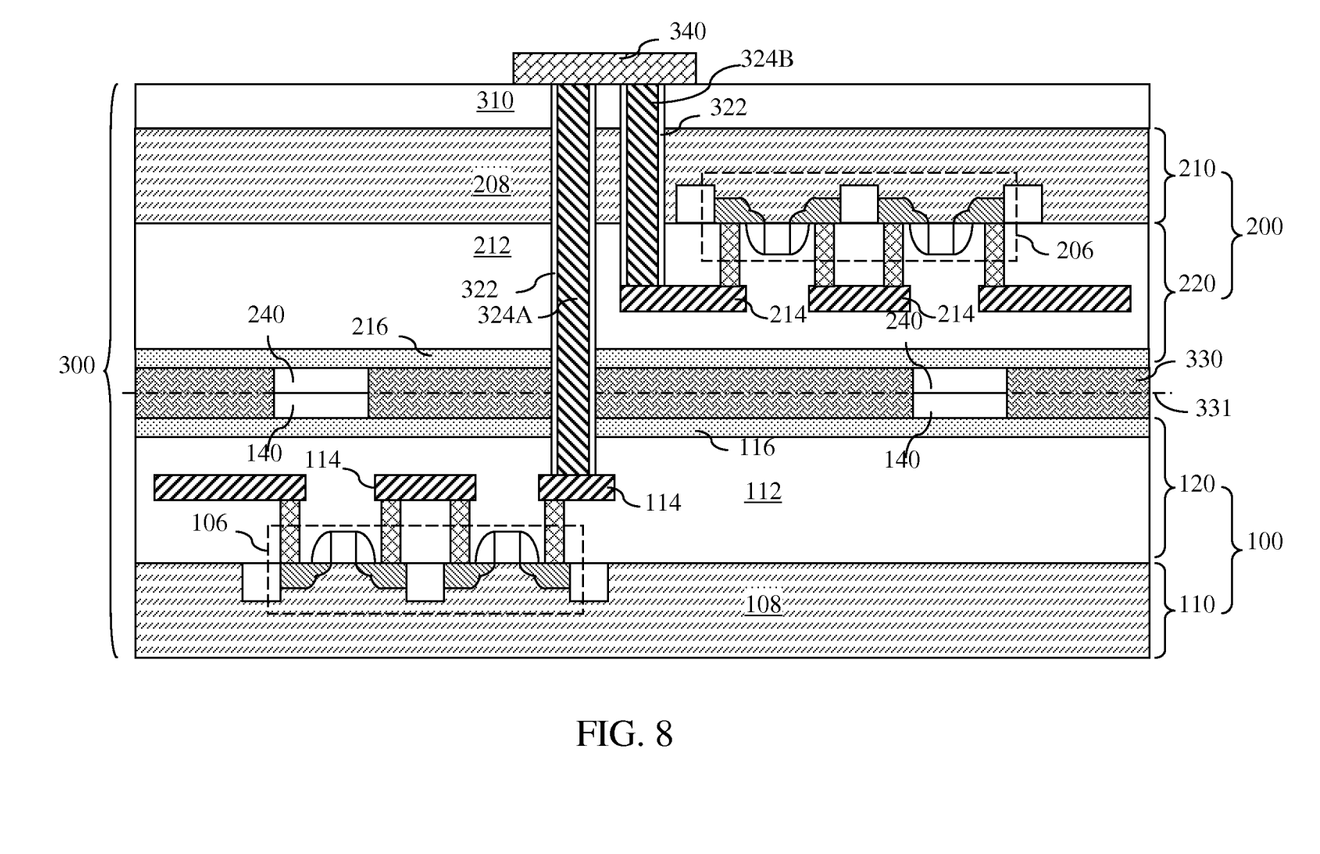
FIG. 8 is a vertical cross-sectional view of the second exemplary structure after formation of conductive inter-substrate connection structures according to the second embodiment of the present invention.

Referring to FIG. 8, the second exemplary structure after formation of conductive inter-substrate connection structures according to the second embodiment of the present invention is shown. The first and second bonding material layers are bonded to each other to form the bonded material layer 330 within which grains extend across the interface 331 to provide adhesion strength between the first and second substrates (100, 200) within the bonded structure 300 as in the first embodiment. The bonded structure 300 includes a vertical stack, from bottom to top, of the first substrate 100, the bonded material layer 330 of the first bonding material layer and the second bonding material layer, and the second substrate 200 as in the first embodiment. The bonded material layer 330 includes grains extending across the interface 331 between the first and second bonding material layers. In addition, the bonded structure 300 includes at least one vertical stack of a first dielectric material portion 140 and a second dielectric material portion 240.

The first bonding material layer below the interface 331 includes at least one first metallic material portion, i.e., at least one portion of the first metallic material of the first bonding material layer. The second bonding material layer above the interface 331 includes at least one second metallic material portion, i.e., at least one portion of the second metallic material of the second bonding material layer. Thus, the first bonding material layer includes at least one first metallic material portion and at least one first dielectric material portion, and the second bonding material layer includes at least one second metallic material portion and at least one second dielectric material portion. The bonded material layer 330 of the second exemplary semiconductor structure can be provided as multiple non-contiguous portions embedded in at least one first dielectric material portion 140 and the at least one second dielectric material portion 240. Alternately or in parallel, the bonded material layer 330 of the second exemplary semiconductor structure can includes holes that embed the at least one first dielectric material portion 140 and the at least one second dielectric material portion 240.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A bonded structure comprising a vertical stack, from bottom to top, of a first substrate, a structurally damaged bonded material layer of a first structurally damaged metallic material layer and a second metallic material layer, and a second substrate, wherein said structurally damaged bonded material layer includes metal grains extending across an interface between said first structurally damaged metallic material layer and said second metallic material layer, wherein said first structurally damaged metallic material layer includes a first metallic composition comprising an ionic species and an elemental metal, and said second metallic material layer includes a second metallic composition comprising an elemental metal, wherein said first metallic composition is different from said second metallic composition.

2. The bonded structure of claim 1, wherein said first metallic composition is a first alloy including a first elemental metal and a second elemental metal in which an atomic concentration of said first elemental metal is greater than 50%, and said second metallic composition is a second alloy of said first elemental metal and said second elemental metal in which an atomic concentration of said first elemental metal is less than 50%.

3. The bonded structure of claim 2, wherein said first elemental metal and said second elemental metal are selected from Cu, Ag, Au, Al, W, Ta, and Ti.

4. The bonded structure of claim 1, wherein said ionic species is selected from Si and Ge.

5. The bonded structure of claim 1, wherein said ionic species is selected from groups VA, VIA, VIIA, and VIIIA in the Periodic Table of Elements.

6. The bonded structure of claim 1, further comprising:
at least one first semiconductor device located in said first substrate;
at least one second semiconductor device located in said second substrate; and
a set of conductive structures that conductively connects said at least one first semiconductor device to said at least one second semiconductor device including a conductive via structure extending at least through said structurally damaged bonded material layer.

7. The bonded structure of claim 1, wherein said first structurally damaged metallic material layer has a first constant thickness and a single contiguous first metallic composition throughout, and said second metallic material layer has a second constant thickness and a single contiguous second metallic composition throughout.

8. The bonded structure of claim 1, further including at least one first dielectric material portion and at least one second dielectric material portion embedded in said structurally damaged bonded material layer, wherein said at least one first dielectric material portion vertically contacts one of said at least one second dielectric material portion.

9. The bonded structure of claim 1, wherein said second metallic material layer is structurally damaged.

10. The bonded structure of claim 9, wherein said second metallic composition further comprises an ionic species.

11. The bonded structure of claim 9, wherein at least one of said first or second structurally damaged metallic material layers is amorphous.

12. The bonded structure of claim 11, wherein both said first structurally damaged metallic material layer and said second structurally damaged metallic material layers are amorphous.

* * * * *